(12) United States Patent
Fischer et al.

(10) Patent No.: US 7,633,149 B2
(45) Date of Patent: Dec. 15, 2009

(54) INTEGRATED CIRCUIT ARRANGEMENT

(75) Inventors: Jurgen Fischer, Deuerling (DE);
Manfred Mengel, Bad Abbach (DE);
Frank Puschner, Kelheim (DE)

(73) Assignee: Infineon Technologies AG, Neubiberg (DE)

( * ) Notice: Subject to any disclaimer, the term of this patent is extended or adjusted under 35 U.S.C. 154(b) by 19 days.

(21) Appl. No.: 10/598,054

(22) PCT Filed: Feb. 14, 2005

(86) PCT No.: PCT/DE2005/000248

§ 371 (c)(1),
(2), (4) Date: Jun. 18, 2007

(87) PCT Pub. No.: WO2005/078794

PCT Pub. Date: Aug. 25, 2005

(65) Prior Publication Data

US 2008/0237837 A1    Oct. 2, 2008

(30) Foreign Application Priority Data

Feb. 16, 2004    (DE) .................. 10 2004 007 690

(51) Int. Cl.
*H01L 23/13* (2006.01)
(52) U.S. Cl. ............... 257/701; 257/E23.004
(58) Field of Classification Search ............ 257/701, 257/E23.004
See application file for complete search history.

(56) References Cited

U.S. PATENT DOCUMENTS

| 5,027,191 | A | * | 6/1991 | Bourdelaise et al. ......... 257/735 |
| 5,650,363 | A | * | 7/1997 | Endroes et al. ............... 438/57 |
| 6,429,530 | B1 | | 8/2002 | Chen |
| 6,791,072 | B1 | * | 9/2004 | Prabhu .................... 250/208.1 |
| 2001/0049155 | A1 | | 12/2001 | Yamaji |
| 2002/0074655 | A1 | | 6/2002 | Uchiyama |
| 2002/0197771 | A1 | | 12/2002 | Dotta et al. |
| 2005/0098472 | A1 | * | 5/2005 | Rissing et al. ............. 206/706 |

FOREIGN PATENT DOCUMENTS

| DE | 198 32 976 A1 | 1/1999 |
| DE | 101 26 508 A1 | 12/2002 |
| EP | 1 028 463 A1 | 8/2000 |
| EP | 1 041 715 A2 | 10/2000 |
| EP | 1 047 128 A2 | 10/2000 |
| JP | 60-747 | 1/1985 |
| JP | 61-101036 | 5/1986 |
| JP | 1-244625 | 3/1988 |
| JP | 2003-174114 A | 6/2003 |
| WO | WO 02/21596 A2 | 3/2002 |
| WO | WO 02/065548 A2 | 8/2002 |

* cited by examiner

*Primary Examiner*—Sue Purvis
*Assistant Examiner*—Krista Soderholm
(74) *Attorney, Agent, or Firm*—Dickstein Shapiro LLP

(57) ABSTRACT

An integrated circuit arrangement including a nonplanar substrate on which an integrated circuit is formed on at least one side, wherein the side of the substrate which has the integrated circuit is arranged on a carrier and the carrier is produced from a chemically resistant material.

21 Claims, 1 Drawing Sheet

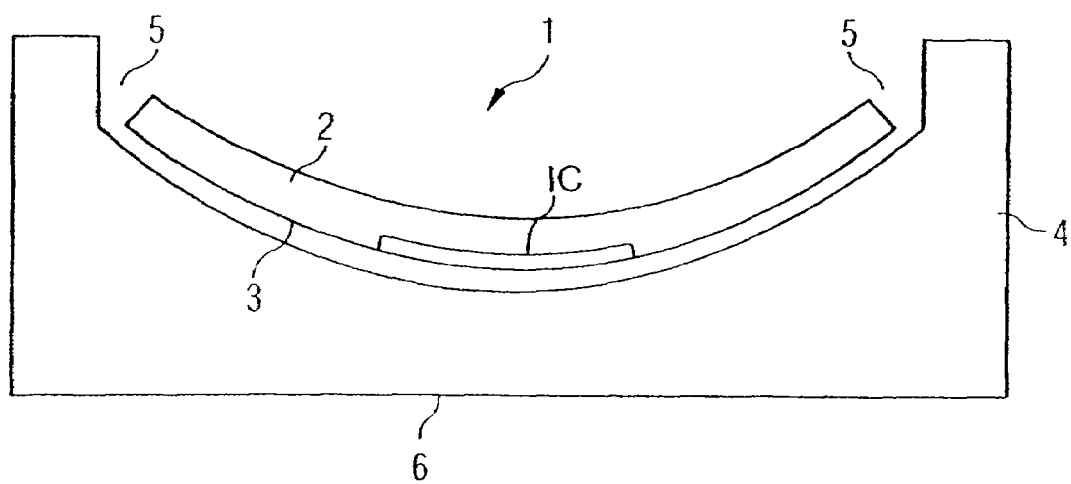

INTEGRATED CIRCUIT ARRANGEMENT

CROSS-REFERENCE TO RELATED APPLICATION

This application is a national stage of International Patent Application Serial No. PCT/DE2005/000248, filed Feb. 14, 2005, which published in German on Aug. 25, 2005 as WO/2005/078794, and is incorporated herein by reference in its entirety.

FIELD OF THE INVENTION

The present invention relates to an integrated circuit arrangement having effective protection against attacks on a circuit that is integrated in the circuit arrangement.

BACKGROUND OF THE INVENTION

In the case of integrated circuits in security-relevant applications, there arises the difficulty of having to protect the circuits against attacks which are intended to covertly discover or analyze the circuit in question, for example by means of FIB (Focused Ion Beam). Optical or mechanical analysis methods are also used.

There are already a number of security concepts with which the integrated circuits can be protected against such attacks, in particular can be provided with a shield in which, for example, active components are used in order to shield an external attack on the circuit. However, the risk of analyzing the circuits from the rear side of a semiconductor chip, i.e. through the semiconductor substrate, has hitherto been ignored.

It is possible to subject an integrated circuit to an analysis, the so-called "Reverse Engineering". This analysis can be used to analyse the method of operation or else to influence the method of operation for the purpose of manipulating data contents or the operating sequence.

For the purpose of the analysis, the material which covers the surface of the chip is dissolved, for example. This material may be either a plastic molding compound, which forms the housing of the semiconductor component, or a so-called "Globe Top", which is used merely to protect the surface of the chip and the electrical connections against mechanical damage. After the material which covers or surrounds the semiconductor chip has been removed, the passivation layer of the semiconductor chip is generally accessible. The layer may be selectively removed by means of etching methods, laser or FIB (Focused Ion Beam) methods. Removing the respective exposed layer in layers and photographing the latter makes it possible to subsequently analyze the structure of the integrated circuit.

So that individual layers cannot be removed using grinding methods such that they can be completely analyzed, the applicant is aware of methods for producing integrated circuit arrangements in which the substrate, on which an integrated circuit is formed, is nonplanar at least in one propagation direction. However, the protective layer which covers the integrated circuit arrangement can still be removed using etching methods so that it is possible to access those layers of the substrate which have the integrated circuit.

SUMMARY OF THE INVENTION

The present invention proposes an integrated circuit arrangement having an integrated circuit that is formed in a substrate, in which it is difficult to expose the substrate and there is thus improved protection against an analysis.

The integrated circuit arrangement includes a nonplanar substrate on which an integrated circuit is formed on at least one side, wherein the at least one side is arranged on a carrier, and the carrier is produced from a chemically resistant material.

BRIEF DESCRIPTION OF THE DRAWING

A description of the inventive integrated circuit arrangement with reference to the accompanying FIGURE follows. This FIGURE shows a cross section of an integrated circuit arrangement having a substrate which is arranged on a carrier.

DETAILED DESCRIPTION OF PREFERRED EMBODIMENTS OF THE INVENTION

The integrated circuit arrangement comprises a curved substrate on which an integrated circuit is formed in a plurality of layers, for example. According to the invention, that side of the substrate which has the integrated circuit is arranged on a chemically resistant carrier.

In one preferred embodiment, the carrier comprises ceramic and has a high chemical resistance, so that the carrier cannot be removed using the conventional etching methods.

A surface of the carrier which faces the substrate is advantageously matched to the curvature of the substrate and can be connected to the substrate in a simple manner in terms of process technology. In this case, the curved carrier additionally defines the curvature of the substrate, so that the substrate can no longer be changed to a planar shape by exerting a pressure, for example.

The FIGURE illustrates the fundamental structure of the integrated circuit arrangement 1. A substrate 2 which is generally constructed from a plurality of layers has an integrated circuit which is constructed in a known manner. The substrate 2 is curved at least in one propagation direction.

In order to protect the integrated circuit from an analysis, that side 3 of the substrate 2 which has the integrated circuit and on which, for example, semiconductor components of the integrated circuit are formed and which is convex on account of the curvature of the substrate 2 is connected to a carrier 4. To this end, the carrier 4 has a cavity 5 which corresponds to the dimensions of the convex surface of the substrate, so that a connection can be achieved in a simple manner, for example by using an adhesive.

In this exemplary embodiment, the cavity 5 which is formed in the carrier 4 is dimensioned in such a manner that the substrate 2 is completely held in the cavity 5 of the carrier 4. The carrier 4 is also planar on a side 6 which is remote from the substrate 2. However, only the basic configuration of the arrangement of a curved substrate 2, which is connected to a carrier 4 that is produced from a chemically resistant material, is important to the invention. The formation of a carrier 4 which has other shapes and is, for example, merely in the form of a complete cover is thus also conceivable.

Manipulating or analyzing the integrated circuit causes the carrier 4 to be removed, so that the underlying layers of the substrate 2 become accessible. As a result of the fact that the carrier 4 is produced from a chemically resistant material, it cannot be removed by etching. The curved carrier 4 defines the substrate curvature, so that the substrate 2 can no longer be changed to a planar shape. The carrier 4 could thus be removed only by means of a grinding process which then also simultaneously destroys the substrate layers which are arranged underneath the carrier 4.

The invention enables very reliable protection against an analysis by combining the use of a curved substrate whose side which has the integrated circuit is arranged on a chemically resistant carrier.

The invention claimed is:

1. An integrated circuit arrangement comprising a nonplanar substrate in which an integrated circuit is formed on a substrate arranged on a carrier and on a same side of the substrate facing the carrier, wherein the carrier is produced from a chemically resistant material.

2. The integrated circuit arrangement as claimed in claim 1, wherein the chemically resistant material of the carrier is formed from ceramic.

3. The integrated circuit arrangement as claimed in claim 2, wherein a side of the carrier which is remote from the integrated circuit has a planar surface.

4. The integrated circuit arrangement as claimed in claim 3, wherein the entire area of the at least one side of the substrate is connected to the carrier.

5. The integrated circuit arrangement as claimed in claim 4, wherein the carrier has a cavity in which the substrate is completely held.

6. The integrated circuit arrangement as claimed in claim 3, wherein the carrier has a cavity in which the substrate is completely held.

7. The integrated circuit arrangement as claimed in claim 2, wherein the entire area of the at least one side of the substrate is connected to the carrier.

8. The integrated circuit arrangement as claimed in claim 7, wherein the carrier has a cavity in which the substrate is completely held.

9. The integrated circuit arrangement as claimed in claim 2, wherein the carrier has a cavity in which the substrate is completely held.

10. The integrated circuit arrangement as claimed in claim 1, wherein a side of the carrier which is remote from the integrated circuit has a planar surface.

11. The integrated circuit arrangement as claimed in claim 10, wherein the entire area of the at least one side of the substrate is connected to the carrier.

12. The integrated circuit arrangement as claimed in claim 11, wherein the carrier has a cavity in which the substrate is completely held.

13. The integrated circuit arrangement as claimed in claim 10, wherein the carrier has a cavity in which the substrate is completely held.

14. The integrated circuit arrangement as claimed in claim 1, wherein the entire area of the at least one side of the substrate is connected to the carrier.

15. The integrated circuit arrangement as claimed in claim 14, wherein the carrier has a cavity in which the substrate is completely held.

16. The integrated circuit arrangement as claimed in claim 1, wherein the carrier has a cavity in which the substrate is completely held.

17. An integrated circuit arrangement comprising a curved substrate having an integrated circuit formed in the substrate arranged on a carrier and on a same side of the substrate facing the carrier, wherein the carrier is produced from a chemically resistant material.

18. The integrated circuit arrangement as claimed in claim 17, wherein the chemically resistant material of the carrier is formed from ceramic.

19. The integrated circuit arrangement as claimed in claim 17, wherein a side of the carrier which is remote from the integrated circuit has a planar surface.

20. The integrated circuit arrangement as claimed in claim 17, wherein the entire area of the outer side of the curved substrate is connected to the carrier.

21. The integrated circuit arrangement as claimed in claim 17, wherein the carrier has a cavity in which the curved substrate is completely held.

* * * * *